United States Patent
Eisele et al.

(10) Patent No.: US 11,626,383 B2
(45) Date of Patent: Apr. 11, 2023

(54) PROCESS AND DEVICE FOR LOW-TEMPERATURE PRESSURE SINTERING

(71) Applicant: DANFOSS SILICON POWER GMBH, Flensburg (DE)

(72) Inventors: Ronald Eisele, Surendorf (DE); Holger Ulrich, Eisendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 73 days.

(21) Appl. No.: 17/126,139

(22) Filed: Dec. 18, 2020

(65) Prior Publication Data

US 2021/0104488 A1   Apr. 8, 2021

Related U.S. Application Data

(62) Division of application No. 15/514,598, filed as application No. PCT/EP2015/071613 on Sep. 21, 2015.

(30) Foreign Application Priority Data

Sep. 29, 2014 (DE) .......................... 102014114093.1

(51) Int. Cl.
   *H01L 21/00* (2006.01)
   *H01L 23/00* (2006.01)
   (Continued)

(52) U.S. Cl.
   CPC ................. *H01L 24/83* (2013.01); *B22F 3/14* (2013.01); *H01L 24/32* (2013.01); *H01L 24/75* (2013.01);
   (Continued)

(58) Field of Classification Search
   CPC ......... H01L 24/83; H01L 24/32; H01L 24/75; H01L 24/29; H01L 2224/29139; H01L 2224/29294; H01L 2224/29295; H01L 2224/29339; H01L 2224/29347; H01L 2224/32225; H01L 2224/75101; H01L 2224/75102; H01L 2224/7511; H01L 2224/7525; H01L 2224/75315;
   (Continued)

(56) References Cited

U.S. PATENT DOCUMENTS 5,074,533 A * 12/1991 Frantz ..................... B22F 3/003
                                                    266/252
6,383,446 B1 * 5/2002 Tokita ..................... B22F 3/003
                                                    419/38
(Continued)

*Primary Examiner* — Kiley S Stoner
(74) *Attorney, Agent, or Firm* — McCormick, Paulding & Huber PLLC

(57) ABSTRACT

Process for producing an electronic subassembly by low-temperature pressure sintering, comprising the following steps: arranging an electronic component on a circuit carrier having a conductor track, connecting the electronic component to the circuit carrier by the low-temperature pressure sintering of a joining material which connects the electronic component to the circuit carrier, characterized in that, to avoid the oxidation of the electronic component or of the conductor track, the low-temperature pressure sintering is carried out in a low-oxygen atmosphere having a relative oxygen content of 0.005 to 0.3%.

3 Claims, 5 Drawing Sheets

(51) Int. Cl.
*H05K 3/32* (2006.01)
*B22F 3/14* (2006.01)

(52) U.S. Cl.
CPC ............ *H05K 3/32* (2013.01); *B22F 2301/10* (2013.01); *B22F 2301/255* (2013.01); *H01L 24/29* (2013.01); *H01L 2224/29139* (2013.01); *H01L 2224/29294* (2013.01); *H01L 2224/29295* (2013.01); *H01L 2224/29339* (2013.01); *H01L 2224/29347* (2013.01); *H01L 2224/32225* (2013.01); *H01L 2224/755* (2013.01); *H01L 2224/7511* (2013.01); *H01L 2224/7525* (2013.01); *H01L 2224/75101* (2013.01); *H01L 2224/75102* (2013.01); *H01L 2224/75315* (2013.01); *H01L 2224/83048* (2013.01); *H01L 2224/83075* (2013.01); *H01L 2224/8384* (2013.01); *H01L 2224/83095* (2013.01); *H01L 2224/83101* (2013.01); *H01L 2224/83201* (2013.01); *H01L 2224/83204* (2013.01); *H01L 2224/83911* (2013.01); *H01L 2224/83948* (2013.01); *H05K 2203/0278* (2013.01); *H05K 2203/1131* (2013.01); *H05K 2203/1157* (2013.01)

(58) Field of Classification Search
CPC ..... H01L 2224/755; H01L 2224/83048; H01L 2224/83075; H01L 2224/83095; H01L 2224/83101; H01L 2224/83201; H01L 2224/83204; H01L 2224/8384; H01L 2224/83911; H01L 2224/83948; B22F 3/14; B22F 2301/10; B22F 2301/255; H05K 3/32; H05K 2203/0278
See application file for complete search history.

(56) References Cited

U.S. PATENT DOCUMENTS

| | | | |
|---|---|---|---|
| 9,688,060 B2 | 6/2017 | Bayerer et al. | |
| 9,956,643 B2 | 5/2018 | Matsubayashi | |
| 10,037,903 B2 | 7/2018 | Matsubayashi | |
| 10,083,844 B2 | 9/2018 | Matsubayashi et al. | |
| 2002/0045144 A1* | 4/2002 | Mori | F27B 21/00 266/176 |
| 2004/0063058 A1* | 4/2004 | Orbeck | F27B 9/20 432/128 |
| 2005/0277244 A1 | 12/2005 | Galster et al. | |
| 2010/0090328 A1 | 4/2010 | Goebl et al. | |
| 2014/0127072 A1* | 5/2014 | Chen | H01F 1/0577 419/60 |
| 2015/0243417 A1* | 8/2015 | Sun | C22C 38/16 241/62 |
| 2015/0257280 A1* | 9/2015 | Ciliox | B23K 31/02 427/372.2 |
| 2020/0114583 A1* | 4/2020 | Wen | B29C 64/245 |
| 2021/0016353 A1 | 1/2021 | Osterwald et al. | |

* cited by examiner

PROCESS AND DEVICE FOR LOW-TEMPERATURE PRESSURE SINTERING

CROSS-REFERENCE TO RELATED APPLICATIONS

This application is a divisional of U.S. patent application Ser. No. 15/514,598, filed Mar. 27, 2017, which is a National Stage application of International Patent Application No. PCT/EP2015/071613, filed on Sep. 21, 2015, which claims priority to German Patent Application No. 102014114093.1, filed on Sep. 29, 2014, each of which is hereby incorporated by reference in its entirety.

TECHNICAL FIELD

The invention relates to a process and to a device for producing an electronic subassembly by low-temperature pressure sintering, comprising the following steps: arranging an electronic component on a circuit carrier having a conductor track, and connecting the electronic component to the circuit carrier by the low-temperature pressure sintering of a joining material which connects the electronic component to the circuit carrier.

BACKGROUND

A process of this type is known, for example, from DE 10 2008 009 510 B3.

A fundamental disadvantage of low-temperature pressure sintering is that the heating up of the components and circuit carriers to be joined not only accelerates the diffusion of the joining material introduced, e.g. silver (Ag), into the connecting metals of the parts to be joined, e.g. precious metals including gold (Au), silver (Ag), platinum (Pt), palladium (Pd), rhodium (Rh), but also assists the oxidation of metallic surfaces. Thus, for example, the oxidation of copper (Cu) begins visibly to proceed more quickly at 80° C. than at room temperature.

Therefore, after going through the pressure sintering process, untreated electronic subassemblies regularly have a highly oxidized state, manifested by a uniformly matt-brown surface rather than the originally bright pink-red copper surfaces.

In order to prevent oxidation of these metal surfaces, a known countermeasure is to coat the copper conductor tracks or conductor areas and the component joining areas with precious metals to protect against oxidation. In particular, Ni-flash Au or Ni—Pd coatings are used for this purpose.

A disadvantage of this protective measure, however, is the increased amount of work and costs, and it has additionally been found that the surfaces treated in this way slow the oxidation, but do not prevent it entirely. In particular, it has been found in experiments that it has not been possible to carry out 2-stage sintering operations, i.e. processes with two sintering operations one after the other, on surfaces protected by these means.

SUMMARY

It is therefore an object of the invention to provide a process for producing an electronic subassembly by means of low-temperature pressure sintering which makes it possible to effectively prevent oxidation of the exposed metal surfaces of the electronic subassembly, in particular of the conductor track(s) and component connections.

According to the invention, this object is achieved by the process and the device having the features of the independent claims. The dependent claims describe advantageous configurations of the invention.

The basic concept of the invention is that of preventing oxidation of the metallic surfaces by the almost complete exclusion of oxygen when carrying out the (thermal) sintering process, in which respect it has been found that complete exclusion of oxygen, i.e. an oxygen-free atmosphere, is obstructive to the sintering operation. According to the invention, the oxygen content for the sintering operation is therefore to be set to a minimum of between 0.005 and 0.3%. Specifically, a quantity small enough so that oxidation processes do not or scarcely take place, and just enough that the sintering operation can proceed successfully and leads to a durable product.

In principle, an upper die and/or a lower die can be provided for the sintering operation, at least one of the two dies being heatable. It is expedient to arrange the circuit carrier on the lower die, the upper die serving to generate a counterpressure. Thus the electronic component is subjected to low-pressure pressure sintering by pressure generated between the upper die and the lower die, with the circuit carrier, by a relative movement of the upper die and the lower die towards one another. To this end, the lower die or the upper die can be movable, or both dies can be moved relative to one another to generate a pressure. It is preferable that the lower die is moved against the stationary upper die, the upper die comprising a pressure pad for quasi-hydrostatic pressure distribution. It is preferable for press mobility that the lower die and/or the upper die is electrohydraulically driven.

In particular, it has been found in the case of sintering devices having an upper die with a pressure pad, that the pressure pad, for example a silicone pad, receives and stores large proportions of oxygen under atmospheric conditions. This increases the oxidation of the metallic parts to be connected during the pressing operation. Therefore, the sintering operation can proceed in a virtually oxygen-free atmosphere as long as an oxygen-containing material is present which contains sufficient oxygen, and which releases it under pressure, such that, in the course of the sintering operation, the aforementioned minimum oxygen concentration in the process atmosphere can be achieved directly at the sintering location by the application of pressure and temperature. An example of such an oxygen-containing material could be a separating film for separating the pressure pad from the component to be sintered, which rests directly on the component to be sintered. It is therefore absolutely necessary for the sintering operation to take place inside a gastight-closable chamber, in which gas replacement of the ambient atmosphere by a low-oxygen atmosphere can take place. By contrast, pure gas dilution by flooding with gases has proved to be inadequate.

In particular it is particularly advantageous, before the sintering operation, to equilibrate the pressure pad, and/or a separating film between the pressure pad and the sintering component, with the low-oxygen atmosphere and to thereby displace oxygen molecules which adhere to the pressure pad or have diffused into it, and to remove these oxygen molecules from the chamber. The materials of which the pressure pad and/or the separating film comprise may absorb gases (including oxygen) from the environments in which they are stored in a similar way to which a sponge may absorb liquids. Such absorbed gases may not immediately leave the materials when the ambient atmosphere is changed, and may continue to diffuse out of the material for a period of time after such a change of atmosphere. In the current invention this may be critical since atmospheric gases, including oxygen, released by the pressure pad and/or separating film materials into the chamber after the chamber has been closed and the atmosphere change, increase the amount of oxygen present is what is preferably a low-oxygen atmosphere. To avoid this happening, after the ambient atmosphere (including oxygen) has been pumped out of the chamber, a period of time for the equilibration of the materials is found to be beneficial. During this period of time the oxygen (and other gases) previously absorbed by the materials of which the pressure pad and/or the separating film comprise may diffuse into the chamber and can be pumped out before the sintering process is started. According to the invention, the period of time which is allowed for equilibration is 0.5 minutes to 20 minutes. Preferably, the period of time which is allowed for equilibration is between 1 minute and 10 minutes, particularly preferably between 3 minutes and 5 minutes. It has also been found that an elevated temperature (a temperature above the ambient temperature) reduces the time required for equilibration, and this is a distinct advantage in shortening the overall cycle time of the inventive method and thus the throughput of electronic subassemblies. The upper limit of such an elevated temperature will be given by the oxidation speed of the material to be sintered. In a case where copper surfaces are being sintered then according to the invention, the temperature of the components within the chamber during equilibration is between 80 and 100 degrees C. Preferably, the temperature of the components within the chamber during equilibration is between 85 and 95 degrees centigrade.

It is advantageous that the separating film consists of a polymer, in particular Teflon (PTFE), since this material is changeable in shape and stable under pressure and prevents contamination of the component to be sintered through material detaching from the pressure pad, in particular silicone residues.

As is known, the process for producing an electronic subassembly by low-temperature pressure sintering thus comprises the steps of arranging an electronic component on a circuit carrier having a conductor track, and connecting the electronic component to the circuit carrier by the low-temperature pressure sintering of a joining material which connects the electronic component to the circuit carrier. According to the invention, it is provided here that, to avoid the oxidation of the electronic component or of the conductor track, the low-temperature pressure sintering is carried out in a low-oxygen atmosphere having a relative oxygen content of 0.005 to 0.3%. The low-oxygen atmosphere preferably has a relative oxygen content of 0.05 to 0.25%, particularly preferably of 0.05 to 0.15%.

The low-oxygen atmosphere preferably comprises nitrogen (N), carbon dioxide ($CO_2$), a noble gas or a mixture of the aforementioned gases, it merely being necessary to pay attention to the aforementioned oxygen proportion which is beneficial to the sintering operation.

If it should be found in a given case that the electronic subassembly is partially oxidized after the low-temperature pressure sintering, the electronic subassembly can be sparged or evaporation-coated with a reducing agent. Methanoic acid ($CH_2O_2$) is suitable with preference for evaporation-coating.

The joining material used is preferably silver (Ag) available in the form of a silver-comprising sintering paste. It is conceivable to provide a Cu/Ag powder, a silver alloy and further constituents in the sintering paste. The sintering paste can be arranged in platelet form between the electronic component and the circuit carrier, and therefore it is possible to achieve simple prefabrication and a uniform coating of the contact point with paste.

It is advantageous that the sintering temperature lies between 230° C. and 300° C., preferably between 240° C. and 280° C., in particular is 250° C., in order to produce a reliable sintered connection in an energy-efficient manner.

It is advantageous that the sintering pressure is between 20 MPa and 40 MPa, preferably between 25 MPa and 35 MPa, in particular is 30 MPa, in order to produce a reliable sintered connection in an energy-efficient manner.

The electronic components can be passive or active components.

A secondary aspect of the invention proposes a device for carrying out one of the aforementioned processes. The device comprises a first chamber (preheating chamber) having a heating device for heating the electronic subassembly up to as much as 100° C. A second chamber (sintering chamber) having an upper and a lower die for carrying out the low-temperature pressure sintering at a temperature of up to 300° C. and a pressure of up to 30 MPa is connected to the first chamber. At least one of the two dies, preferably both dies, are heatable. Furthermore, provision is made of a third chamber (cooling-down chamber), connected to the sintering chamber, for cooling down the sintered electronic subassembly to 80° C. At least the sintering chamber is gastight-closable and equipped with means for generating the low-oxygen atmosphere.

Alternatively, provision can be made of an individual sintering chamber set up to carry out the pressure chamber sintering under pressure and temperature. This individual chamber can furthermore be set up to preheat and/or cool down the electronic subassembly.

Alternatively, provision can be made of a preheating chamber and a sintering chamber with a cooling-down capability or a sintering chamber with a preheating capability with a connected cooling-down chamber.

It is advantageous that provision can be made of a fourth chamber (reducing chamber), which connects the sintering chamber to the cooling-down chamber and has means for introducing a gaseous or vaporous reducing agent, in particular formic acid. Alternatively, means for introducing a sparged or evaporation-coating reducing agent can be provided in a single sintering chamber or in the cooling-down chamber. The reducing chamber can comprise a heating device designed to support a relatively flat cooling-down ramp from the sintering temperature to the cooling-down temperature, such that the electronic component can already be cooled down in a controlled manner in the reducing chamber during the reducing operation, in order to shorten a cooling-down time or to achieve a desired flat temperature cooling-down ramp of the component temperature.

It is preferable that two adjacent chambers, in particular all chambers, can be connected in a gastight manner and in particular in a vacuum atmosphere by means of chamber separating devices. The chamber separating device can be in the form of a transfer device with two vacuum gate valves or in the form of a valve gate device with a vacuum gate valve. Temperatures and atmospheric conditions which are separated from one another can thereby be provided in the individual chambers.

In principle, two or more chambers are arranged linearly in succession, such that an electronic component can be processed in sequence in a linear cycle process. Alternatively, it is conceivable to arrange the chambers in an arc or in a circle, in which case the components to be processed can be guided into and removed from each chamber centrally, and can be brought into a different chamber, such that a round cycle process can be implemented. In this respect, the chambers cannot be connected to one another, but instead have transfer or gate devices to a moving device, in particular to a transportation robot, which can transport a component from one chamber into a further chamber. In this case, in the absence of one chamber, another chamber can perform the task thereof, without the manufacturing process being interrupted, as a result of which it is possible to achieve a high degree of flexibility and a reduced susceptibility of the sintering process to interference.

In an advantageous development, provision can be made of an electrohydraulic drive of the lower die, the lower die having a die cylinder. The die cylinder can comprise a piston rod and a piston ring in a hydraulic sump, the piston rod having a diameter which is greater than or equal to the die diameter of the lower die. The piston rod can be axially guided and held in the cylinder housing by the piston ring. This provides a press device in the sintering chamber which can be formed as a compact structural unit and can achieve a high degree of parallelism of the die surfaces and also precise X/Y orientation of upper die and lower die and also a uniform pressure generation.

BRIEF DESCRIPTION OF THE DRAWINGS

The invention will be explained in more detail on the basis of an exemplary embodiment shown in the accompanying drawings, in which.

DETAILED DESCRIPTION

Figure 1:
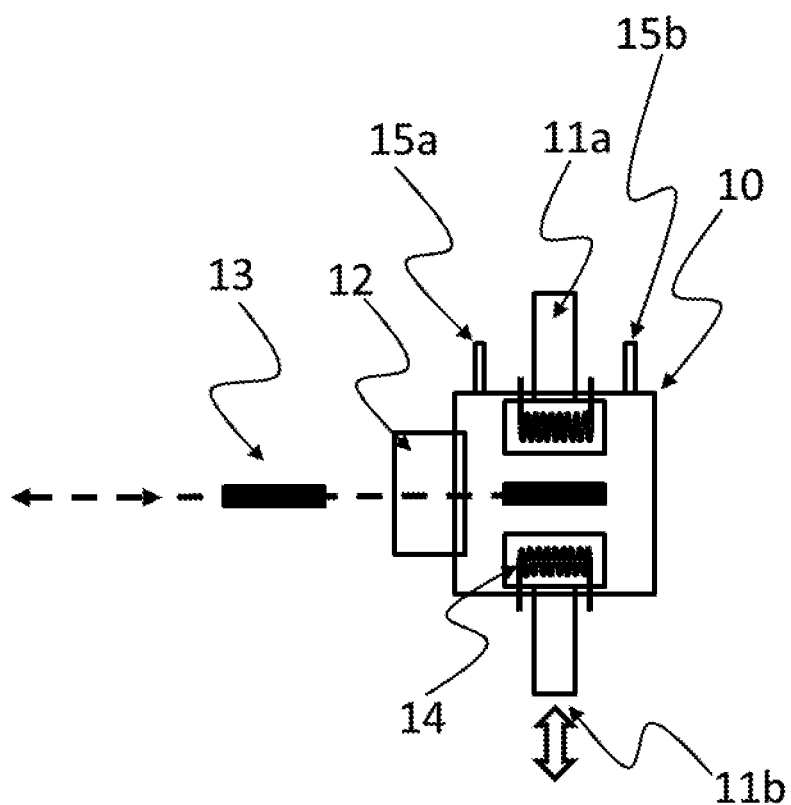
FIG. 1 shows a device for carrying out the process for producing an electronic subassembly by means of low-temperature pressure sintering having a single sintering chamber.

FIG. 1 shows a device for carrying out the process for producing an electronic subassembly by means of low-temperature pressure sintering having a single sintering chamber.

The single sintering chamber 10 has a charging opening 12 for a work carrier 13, which is set up to receive a subassembly to be processed. Within the sintering chamber 10 there is a press, consisting of the respectively heatable/coolable lower and upper die units 11a and 11b. To carry out the process according to the invention, the work carrier 13 passes the charging opening 12 and is placed between the lower and upper die units 11a and 11b, the subassembly (not shown) being sintered by moving the dies 11a, 11b together and by heating. It is furthermore conceivable that one of the two dies 11a, 11b is stationary and the respective other die 11a, 11b moves in relation to the stationary die 11a, 11b. After completion of the sintering, the work carrier 13 with the subassembly is removed again through the charging opening 12 by being moved out. A parallel relative orientation of the two dies 11a, 11b which is precise in an X/Y plane is desirable to generate a constant sintering pressure, and this can be achieved by way of a setting device (not shown) of a press device. The setting device can adjust the upper and/or the lower die 11a, 11b with respect to one another in an X/Y direction and bring about a parallel orientation of the die surfaces.

Optionally, a reduction of any oxide films present may be performed in the sintering chamber 10 after the sintering operation and opening of the dies 11a, 11b. The creation of a sintering atmosphere takes place through the filling and emptying nozzles 15a, 15b after charging the sintering chamber 10 with the work carrier 13.

Figure 2:
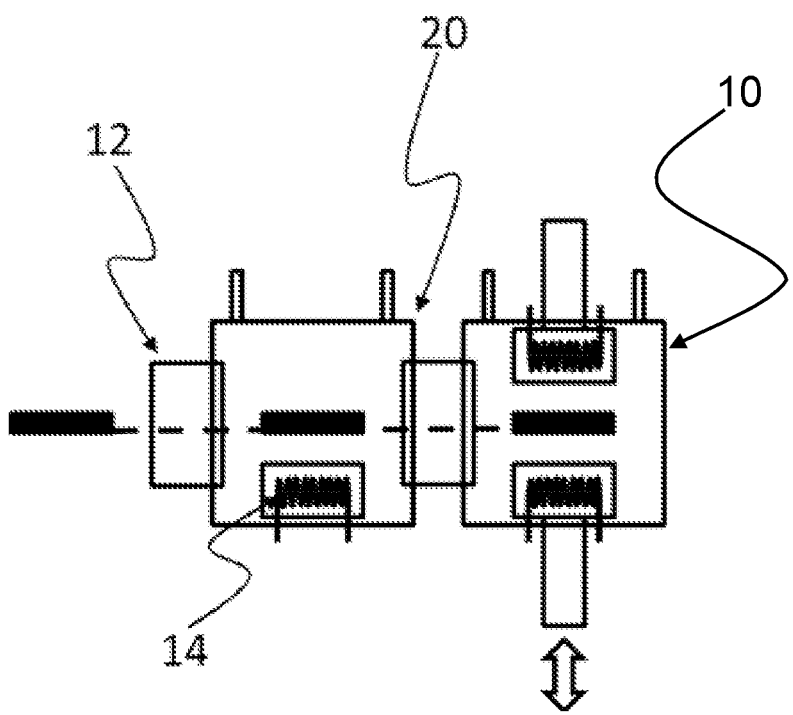
FIG. 2 shows a device for carrying out the process for producing an electronic subassembly by means of low-temperature pressure sintering having two chambers.

FIG. 2 shows a preferred configuration of a device for carrying out the process for producing an electronic subassembly by means of low-temperature pressure sintering having two chambers.

The structure of this device is largely identical to the structure shown in FIG. 1, but supplemented by a preheating chamber 20 which is arranged upstream of the sintering chamber 10 and in which the substrate is preheated in an oxygen-free manner and is also cooled down in an oxygen-free manner after the sintering in the sintering chamber 10. An advantage of the 2-chamber solution over the 1-chamber solution shown in FIG. 1 is the faster cycle rate, since the heating system 14 in the sintering chamber 10 then does not have to heat the entire thermal mass to sintering temperature and cool it down again.

Figure 3:
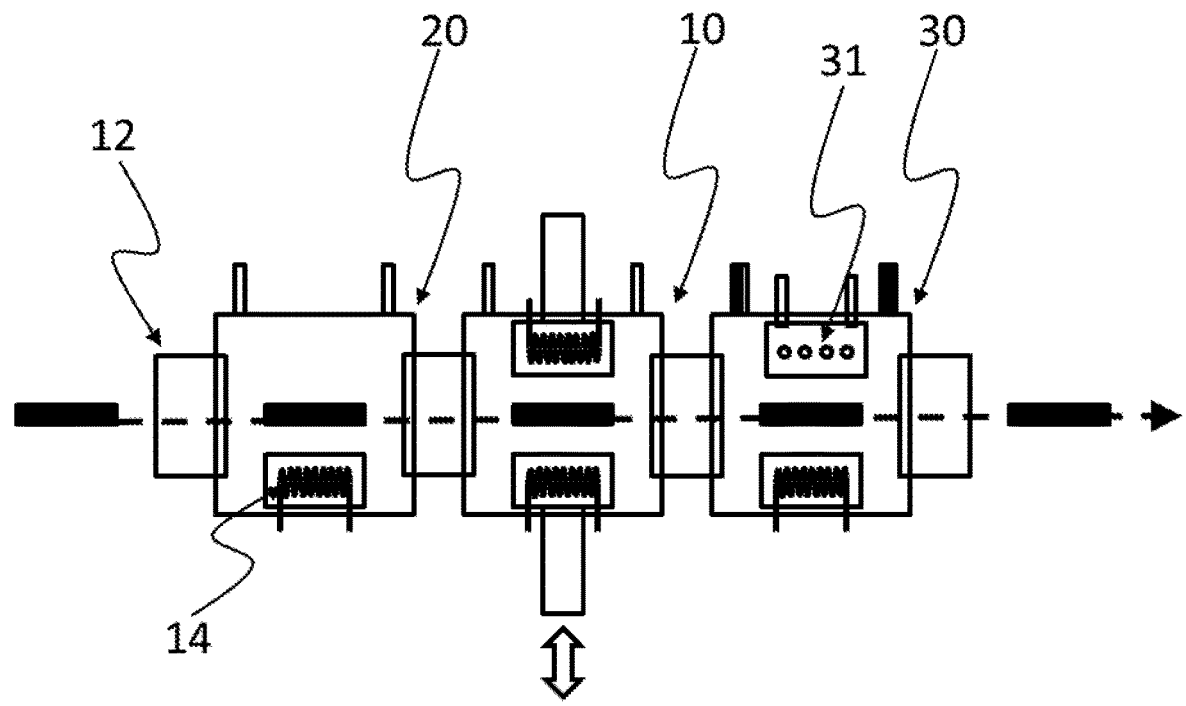
FIG. 3 shows a device for carrying out the process for producing an electronic subassembly by means of low-temperature pressure sintering having three chambers.

FIG. 3 shows a device of particularly preferable configuration for carrying out the process for producing an electronic subassembly by means of low-temperature pressure sintering having three chambers, the 3-chamber solution making it possible to pass the work carrier 13 in series through the preheating chamber 20 (oxygen-free heating up), the sintering chamber 10 (low-oxygen sintering) and the cool-down chamber 30 (oxygen-free cooling down to room temperature).

Figure 4:
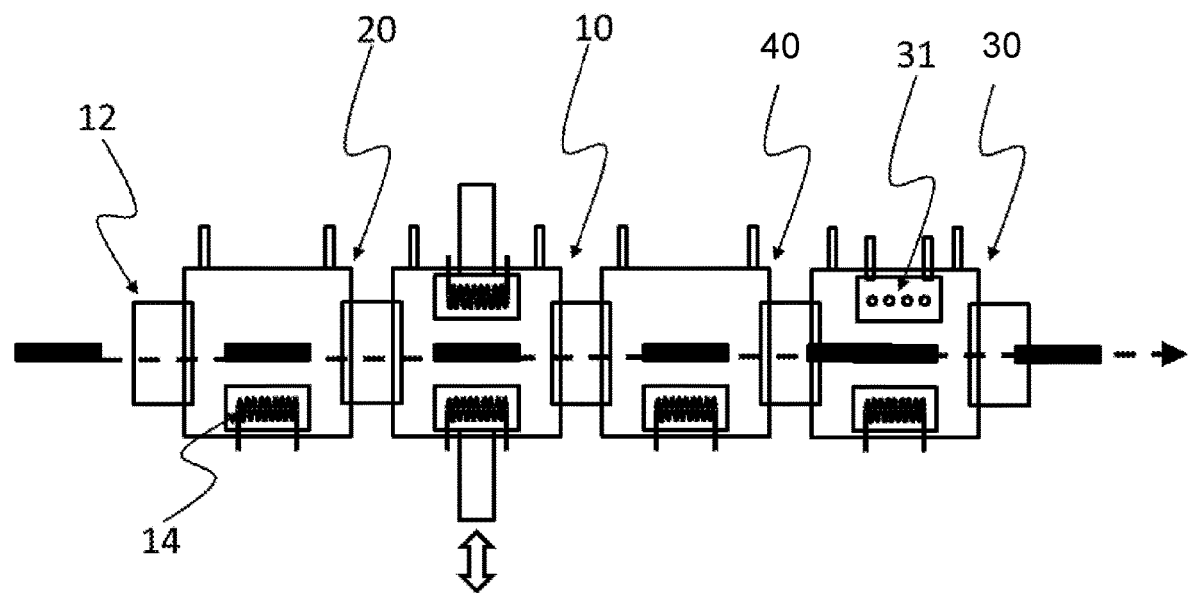
FIG. 4 shows a device for carrying out the process for producing an electronic subassembly by means of low-temperature pressure sintering having four chambers.

FIG. 4 shows a device of extremely preferable configuration for carrying out the process for producing an electronic subassembly by means of low-temperature pressure sintering having four chambers.

The 4-chamber solution largely corresponds in functionality to the 3-chamber solution, but is additionally equipped with a reducing chamber 40 that allows the active reduction of residual oxides after sintering. The provision of a reducing chamber 40 between the sintering and cool-down chambers 10, 30 as shown in FIG. 4 is particularly advantageous, since it has been found that the surfaces in vacuum furnaces are in practice covered with residues of the combustion products, where anchored clusters of oxygen form. These clusters are only dislodged after extended baking and evacuating phases. These baking phases are undesired while production is in progress, however.

It is therefore proposed to perform an active reduction of the oxygen clusters and oxide formations after the oxygen-free or low-oxygen sintering in the reducing chamber 40. This can preferably be performed by components of hydrogen or vaporous formic acid components (methanoic acid $CH_2O_2$). The oxygen-free cooling down for discharging is subsequently possible in the fourth chamber 40.

The work carriers are generally transported in synchronous steps, in series through all of the chambers, the slowest process step in one of the 4 chambers determining the cycle time.

Figure 6:
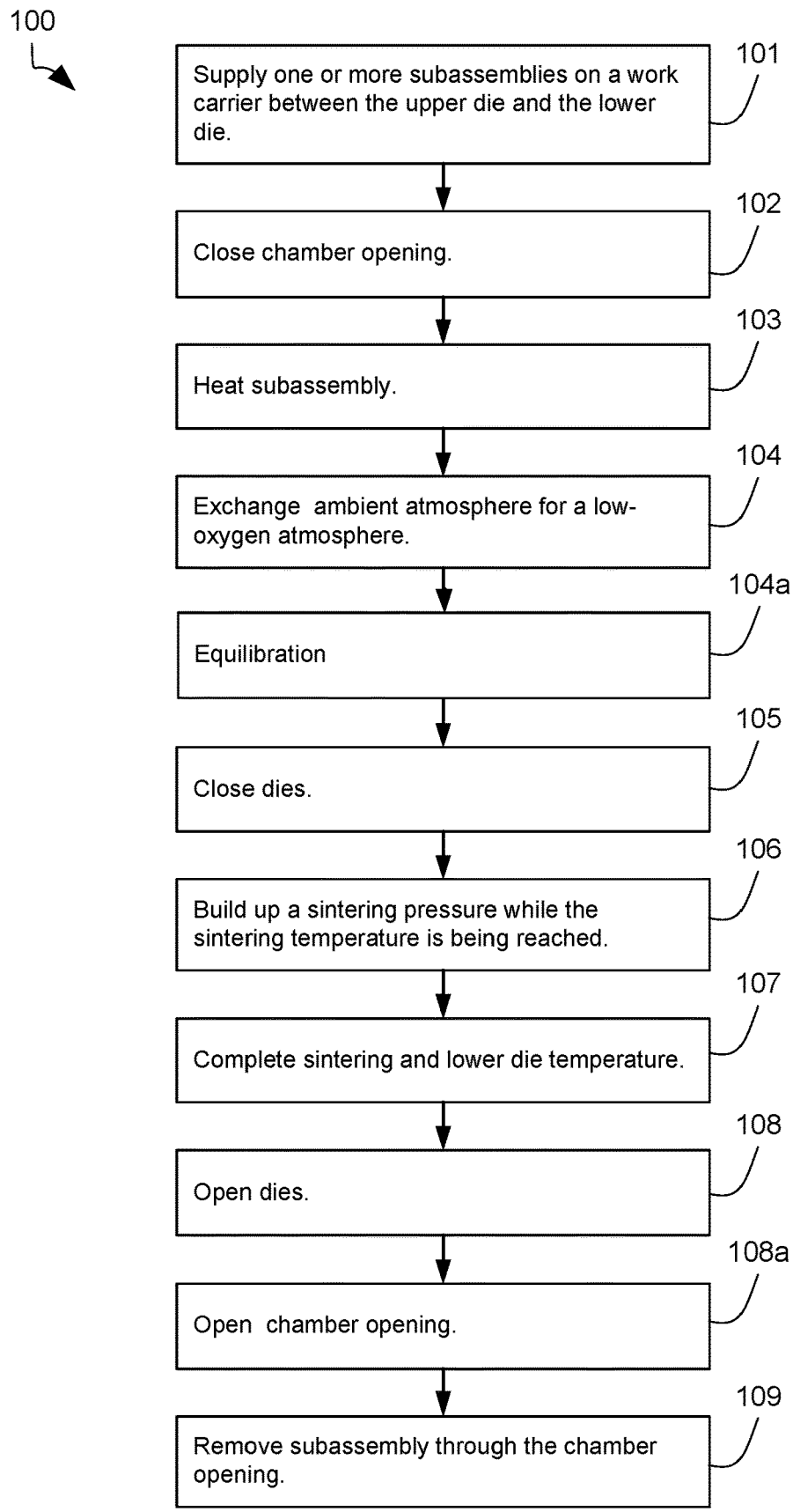
FIG. 6 shows a flow diagram of the method according to the invention.

The process 100 then proceeds as follows (see FIG. 6):
supplying the subassembly to be sintered, or optionally subassemblies, on a work carrier through the gastight-closable opening into the pressure space between the upper die and the lower die 101;
closing the opening 102 followed by heating 103, gas exchange of the ambient atmosphere for the (technical) low-oxygen atmosphere (e.g. nitrogen) 104, waiting for the materials within the chamber to equilibrate with the low-oxygen atmosphere 104a, closing the upper and lower dies 105, building up a sintering pressure while the sintering temperature is being reached 106;
completion of the low-temperature pressure sintering and lowering of the die temperature to below 80° C. 107, opening the upper and lower dies 108, removal of the subassembly or the work carrier through the chamber opening 109; and
providing the equipment for subsequent sintering.

In particular, the described chambers can have two gastight-closable openings, through which continuous, serial charging can take place through an inlet opening and the removal can take place through the second opening.

Figure 7:
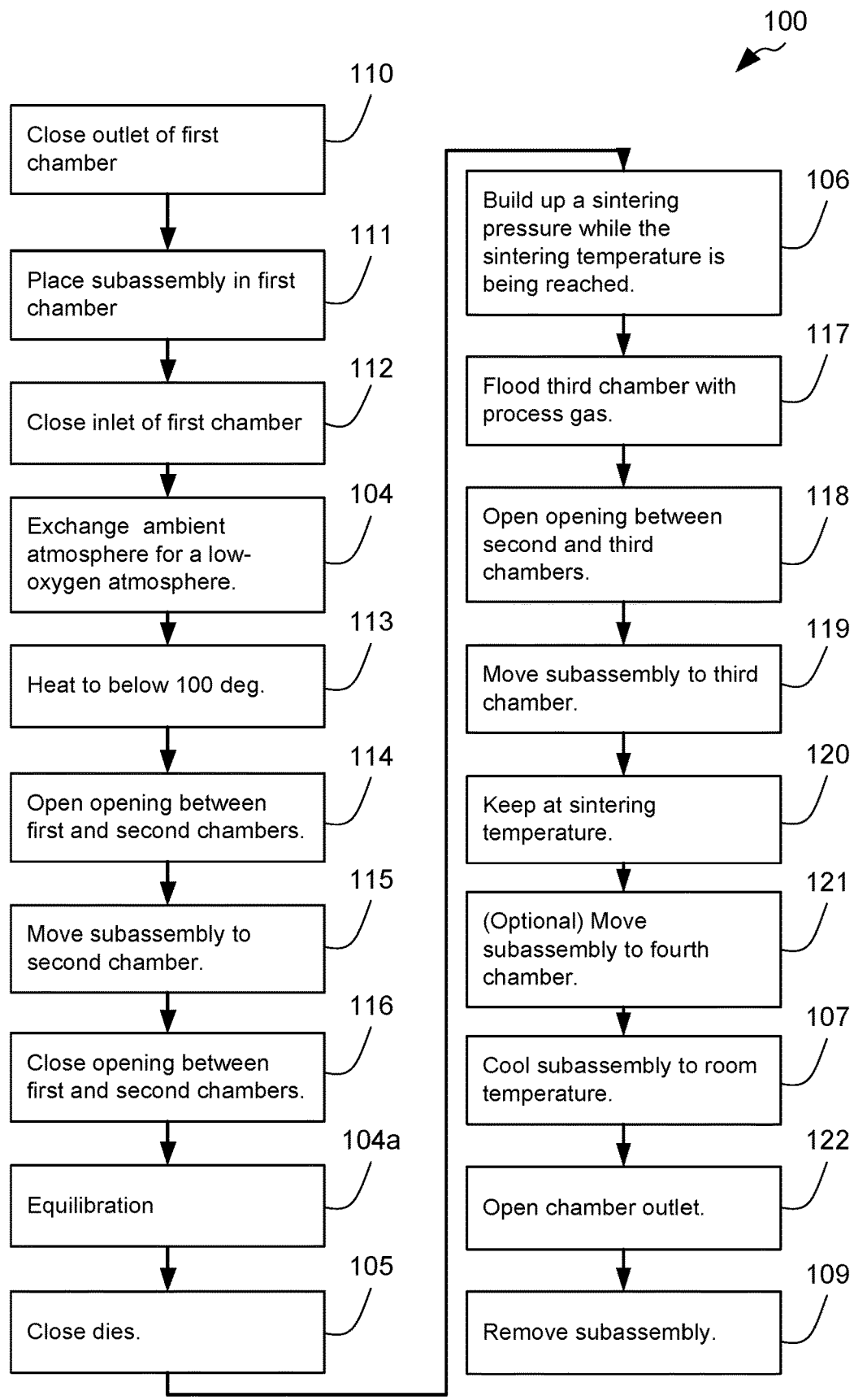
FIG. 7 shows a flow diagram of the method according to the invention in an embodiment utilising more than one chamber.

A continuous work flow and an increase in the throughput of the device are achieved by the following measures, which can also be applied individually, and are illustrated in FIG. 7:

In a preheating chamber 20 with an approximately gastight closure and an inlet opening, the work carrier is supplied 111 and the inlet opening is closed 112. The outlet opening of the preheating chamber 20 is also the inlet opening of the sintering chamber 10. This outlet opening is closed 110 when the inlet opening is open. When both gastight-closable openings are closed, the gas exchange 104 of the ambient atmosphere for the process gas atmosphere takes place in the preheating chamber 20.

After the gas exchange, heating of the work carrier takes place up to a limit below initial sintering (e.g. 100° C.) 113. Subsequently, the second opening is opened 114 and the work carrier is brought 115 by a transporting device from the preheating chamber 20 through the second opening into the sintering chamber 10.

In the sintering chamber 10, the process gas atmosphere permanently prevails. This sintering chamber 10 likewise has an inlet opening and an outlet opening. When the work carrier enters the sintering chamber 10, the outlet opening of the reducing chamber 40 is closed. In the sintering chamber 10, the work carrier is placed between the upper die and the lower die of the compaction device. The materials within the sintering chamber are then allowed to equilibrate with the low-oxygen atmosphere for a period of time 104a. Then, the further heating of the work carrier and the compaction of the joining layer are brought about by moving the upper die and the lower die together 105. It has been found that the compaction also has a positive influence on the heat transfers, and therefore the heating is preferably performed with the dies moved together 106. After carrying out the sintering, the dies are moved apart and the reducing chamber 40 is flooded 117 with process gas. Subsequently, the third opening is opened 118 and the work carrier is brought 119 by a transporting device from the sintering chamber 10 through the third opening into the reducing chamber 40.

The reducing chamber 40 optionally has process gas enrichment with reducing constituents. These may be components of hydrogen or vaporous formic acid components (methanoic acid $CH_2O_2$). These substances reduce oxides occurring on the metals, copper oxides in particular. This helps to eliminate oxides in the event that the formation of oxides in the preheating and in the sintering chamber 20, 10 has not been prevented completely in the heating-up and sintering phases. During the dwell time in the reducing chamber 40, the work carrier is kept 120 at the sintering temperature. It has been found that the reduction of the oxides is then at an optimum, and at the same time the sintering continues.

The process gas enrichment can be permanently maintained in the reducing chamber 40. After completion of the reducing and sintering processes in the reducing chamber 40, the cool-down chamber 30 is flooded with process gas (without reduction enrichment). Subsequently, the fourth opening is opened and the work carrier is brought 121 by a transporting device from the reducing chamber 40 through the fourth opening into the cool-down chamber 30.

The cool-down chamber 30 serves for cooling down 107 to room temperature under process gas, which is carried out until 80° C. is reached, the temperature at which continued oxidation become uncritical. The cooling is assisted by a dwelling plate for the work carrier set to 80° C. Through mechanical contact with the electronic component, the dwelling plate 31 can perform controlled cooling down by a predefinable temperature cooling ramp. The dwelling plate 31 can be in the form of a cooling or heating device through which fluid flows. When the temperature of 80° C. has been reached, the work carrier can be discharged 109 by opening 122 the fifth opening. This is followed by refilling the cool-down chamber 30 with process gas for the next work carrier, which is fed in from the reducing chamber 40 for oxygen-free cooling down.

The functioning of the chambers and the activation of the transfer-gastight-closable openings are preferably synchronized by a common working cycle generator. The working cycle is determined by the slowest process step. This is the low-temperature pressure sintering in the sintering chamber 10, which takes about 10 minutes. Cycle rates of at least 3 minutes up to 21 minutes can likewise be set. It is of advantage for achieving the respective objectives of the processes in the chambers for the work carriers to dwell longer in chambers 20, 40 and 30, and this should therefore be tolerated without restriction. The individual objectives of the processes in the chambers are:
Preheating chamber 20: oxygen-free heating up to as much as 100° C.
Sintering chamber 10: low-oxygen pressure sintering at a maximum of 300° C. and a maximum of 30 MPa
Reducing chamber 40: optional reduction of residual oxides
Cool-down chamber 30: oxygen-free cooling down to 80° C.

Figure 5:
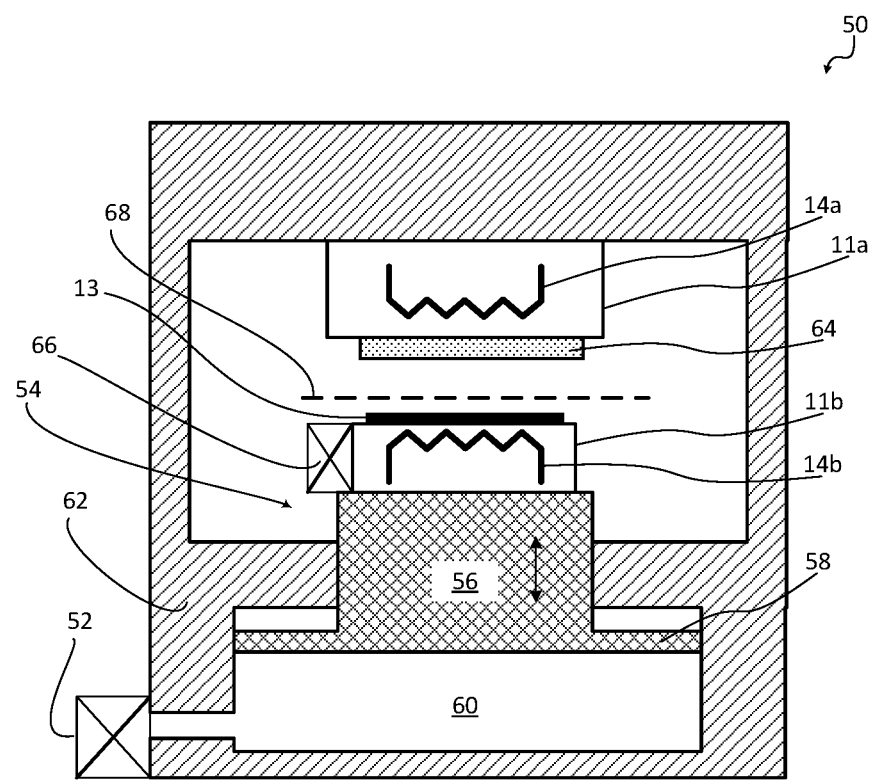
FIG. 5 shows a schematic structure of a press device for a sintering chamber according to the invention.

FIG. 5 shows an exemplary embodiment of a press device 50 for use in a sintering chamber 10. The press device 50 has an electrohydraulic drive 52, with the aid of which the lower die 11b can move against the stationary upper die 11a to generate the sintering pressure. The drive 52 is designed to achieve a press pressure of 30 MPa. The upper die 11a comprises a heating device 14a and the lower die 11b comprises a heating device 14b. A pressure pad 64 made of silicone is arranged on the upper die for generating an quasi-hydrostatic sintering pressure on a sintering component mounted on a work carrier 13. A separating film 68 for separating the pressure pad 64 from the component to be sintered rests directly on the component to be sintered during the sintering process. The lower die 11b is arranged on a die cylinder 54, the diameter of which is greater than the diameter of the lower die 11b. The die cylinder 54 comprises a piston rod 56, which is guided and oriented by a piston ring 58 in a hydraulic sump 60 of a cylinder housing 62 such that the surface of the lower die 11b is oriented parallel to the surface of the upper die 11a. The lower die 11b can be oriented with respect to the upper die 11a in the X/Y surface plane of the lower die 11b by means of a setting device 66. The piston ring 58 bears and guides the piston rod 56 and defines a uniform and oriented movement of the lower die 11b in a vertical direction towards the upper die 11b.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A device for carrying out a process for producing an electronic subassembly by low-temperature pressure sintering, the process comprising the following steps:
   arranging an electronic component on a circuit carrier having a conductor track,
   connecting the electronic component to the circuit carrier by the low-temperature pressure sintering of a joining material which connects the electronic component to the circuit carrier,
   wherein to avoid the oxidation of the electronic component or of the conductor track, the low-temperature pressure sintering is carried out in one or more closable sintering chambers comprising a low-oxygen atmosphere having a relative oxygen content of 0.005 to 0.3%,
   the device comprising:
   the one or more chambers having a heating device for heating the electronic subassembly up to as much as 300° C. and having an upper and a lower die, at least one of the two dies being heatable, for carrying out the low-temperature pressure sintering at a temperature of up to 300° C. and a pressure of up to 30 MPa,
   the one or more chambers being suitable for cooling down the sintered electronic subassembly to 80° C. in a controlled manner, and
   the one or more chambers being gastight-closable are configured for generating the low-oxygen atmosphere,
   a preheating chamber having a heating device for heating the electronic subassembly up to as much as 100° C.,
   a sintering chamber, connected to the preheating chamber, having an upper and a lower die, at least one of the two dies being heatable, for carrying out the low-temperature pressure sintering at a temperature of up to 300° C. and a pressure of up to 30 MPa, and
   a cool-down chamber, connected to the sintering chamber, for cooling down the sintered electronic subassembly to 80° C.,
   at least the sintering chamber being gastight-closable and being configured for generating the low-oxygen atmosphere,
   wherein a reducing chamber, which connects the sintering chamber to the cool-down chamber, is configured for introducing a sparged or evaporation-coating reducing agent, or is configured for introducing a gaseous or evaporation-coating reducing agent.

2. The device according to claim 1, further comprising a press device having an electrohydraulic drive of the lower die, the lower die having a die cylinder comprising a piston rod and a piston ring in a hydraulic sump, the piston rod having a diameter which is greater than or equal to the die diameter of the lower die and the piston rod being axially guided and held in the cylinder housing by the piston ring.

3. A device for carrying out a process for producing an electronic subassembly by low-temperature pressure sintering, the process comprising the following steps:
   arranging an electronic component on a circuit carrier having a conductor track,
   connecting the electronic component to the circuit carrier by the low-temperature pressure sintering of a joining material which connects the electronic component to the circuit carrier,
   wherein to avoid the oxidation of the electronic component or of the conductor track, the low-temperature pressure sintering is carried out in a closable sintering chamber comprising a low-oxygen atmosphere having a relative oxygen content of 0.005 to 0.3%,
   the device comprising:
   a chamber having a heating device for heating the electronic subassembly up to as much as 300° C. and having an upper and a lower die, at least one of the two dies being heatable, for carrying out the low-temperature pressure sintering at a temperature of up to 300° C. and a pressure of up to 30 MPa,
   the chamber being suitable for cooling down the sintered electronic subassembly to 80° C. in a controlled manner, and
   the chamber being gastight-closable and being configured for generating the low-oxygen atmosphere,
   further comprising a press device having an electrohydraulic drive of the lower die, the lower die having a die cylinder comprising a piston rod and a piston ring in a hydraulic sump, the piston rod having a diameter which is greater than or equal to the die diameter of the lower die and the piston rod being axially guided and held in the cylinder housing by the piston ring.

* * * * *